United States Patent
Hung et al.

(10) Patent No.: US 6,750,726 B1
(45) Date of Patent: Jun. 15, 2004

(54) OSCILLATOR CIRCUIT WITH FLICKER NOISE SUPPRESSION AND METHOD FOR OPERATING THE SAME

(75) Inventors: Chih-Jen Hung, Sunnyvale, CA (US); Ravindra Shenoy, Sunnyvale, CA (US); Samuel W. Sheng, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/301,099

(22) Filed: Nov. 20, 2002

(51) Int. Cl.$^7$ ................................................. H03B 5/08
(52) U.S. Cl. ...................... 331/100; 331/117 R; 331/74
(58) Field of Search ............................. 331/100, 117 R, 331/74, 109, 175, 183, 186, 117 FE

(56) References Cited

U.S. PATENT DOCUMENTS

| | | | |
|---|---|---|---|
| 4,661,785 A | * 4/1987 | Benjaminson | 331/109 |
| 6,064,277 A | * 5/2000 | Gilbert | 331/117 R |
| 6,150,893 A | * 11/2000 | Fattaruso | 331/117 R |
| 2003/0001685 A1 | * 1/2003 | Groe et al. | 331/185 |

OTHER PUBLICATIONS

Ali Hajimira and Thomas H. Lee, "Design Issues in CMOS Differential LC Oscillators", IEEE Journal of Solid State Circuits, vol. 34, No. 5, May 1999, (pp. 717–724).

* cited by examiner

*Primary Examiner*—Joseph Chang
(74) *Attorney, Agent, or Firm*—Thelen, Reid & Priest, LLP

(57) ABSTRACT

An oscillator circuit includes an electrical load, a first metal oxide semiconductor (MOS) devise, a second MOS device, and a negative feedback circuit. The electrical load is coupled between a first node and a second node. The first MOS device is coupled between the first node and a third node, and controls a first current flowing from the first node to the third node. The second MOS device is coupled between the second node and a fourth node, and controls a second current flowing from the second node to the fourth node. A positive feedback circuit is formed with the first and second MOS devices. The positive feedback circuit has inputs from the first and second nodes and outputs to the first and second MOS devices. The negative feedback circuit has inputs from the third and fourth nodes and outs to the first and second MOS devices.

26 Claims, 5 Drawing Sheets

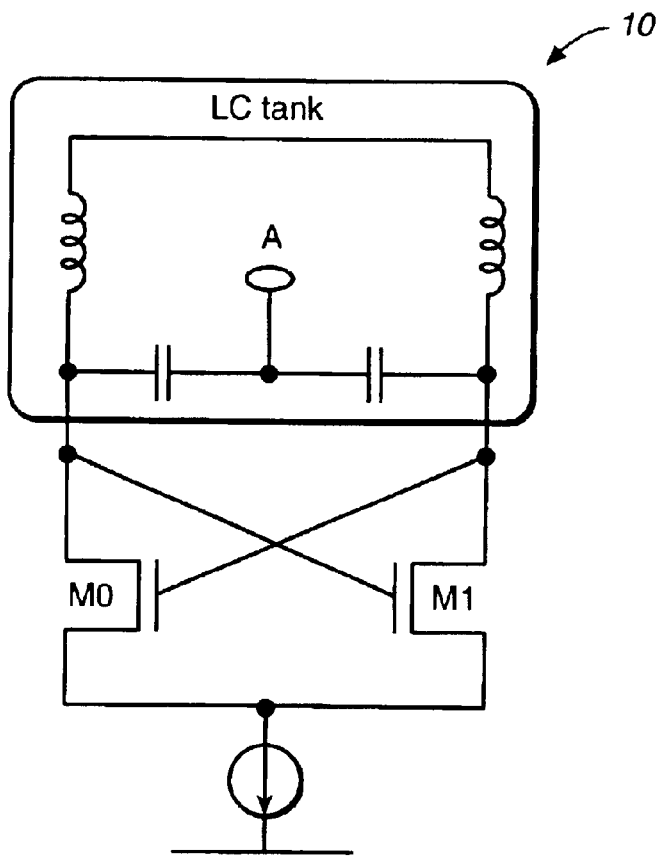
FIG._1
*(PRIOR ART)*
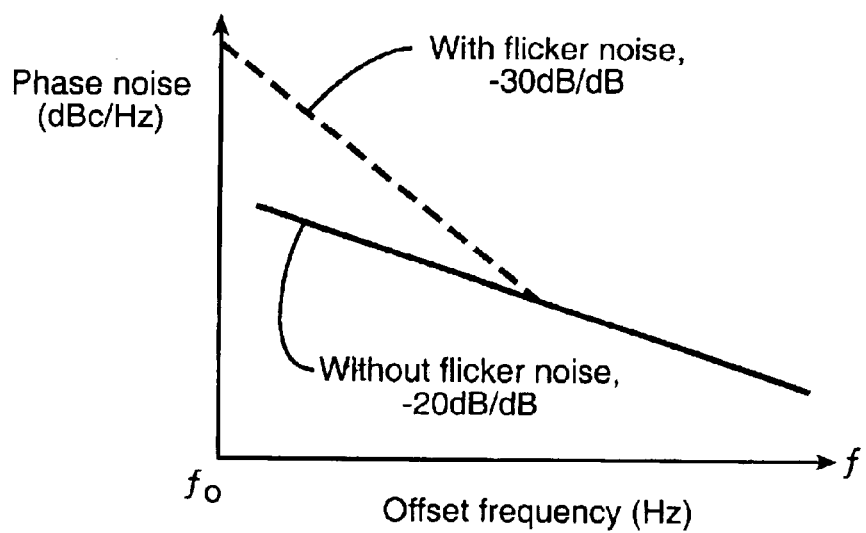
FIG._2

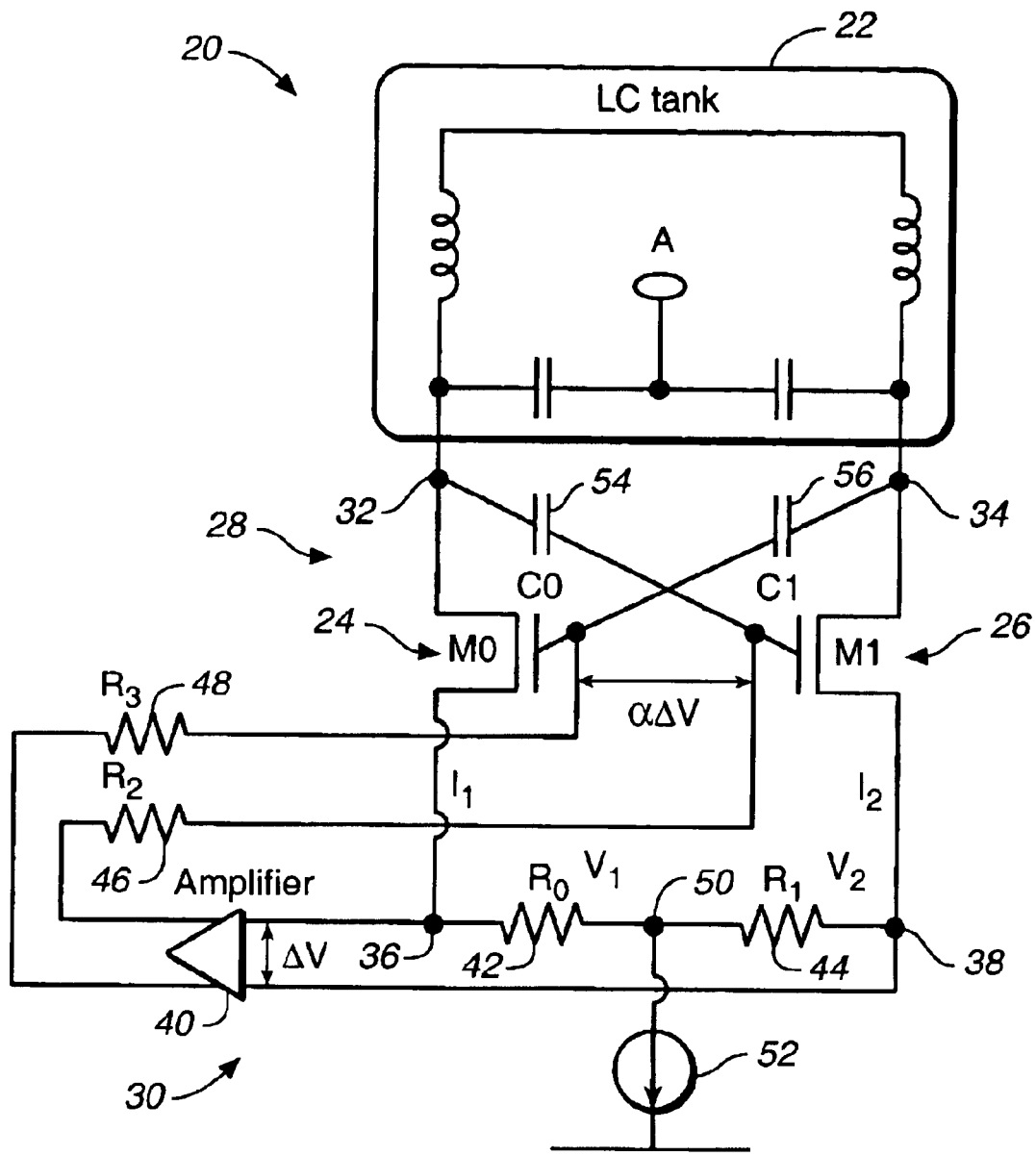
FIG._3

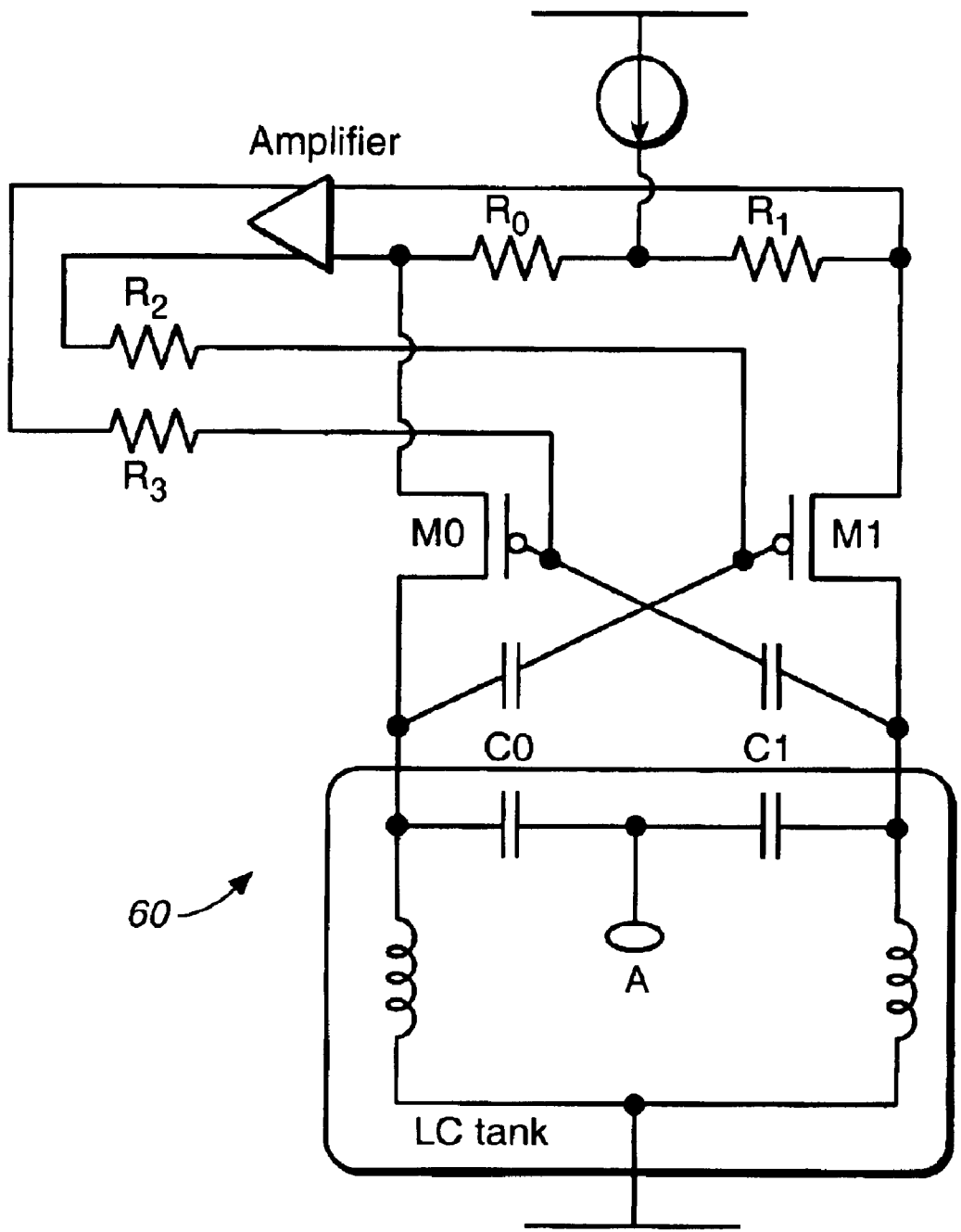
FIG._4

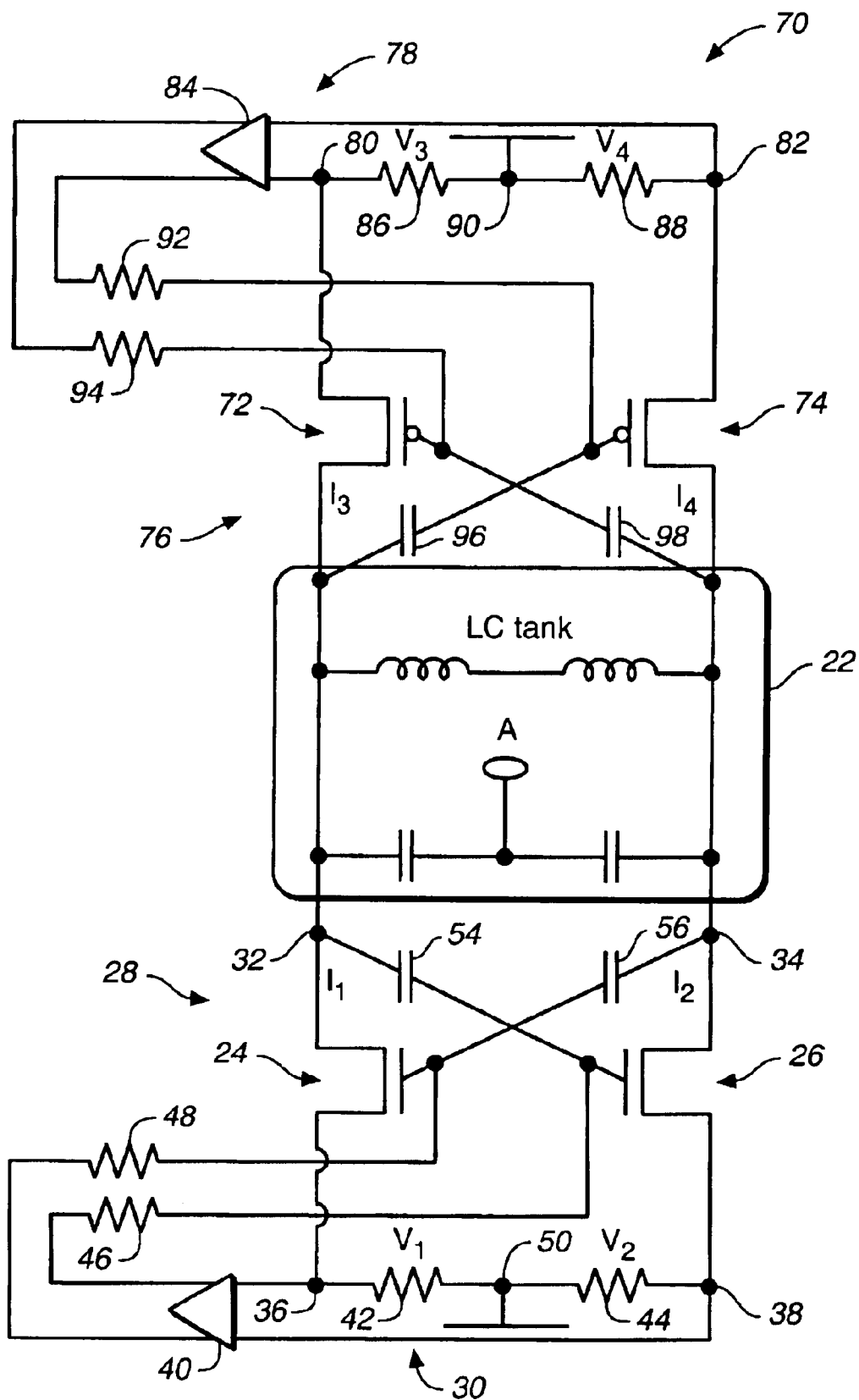
FIG._5

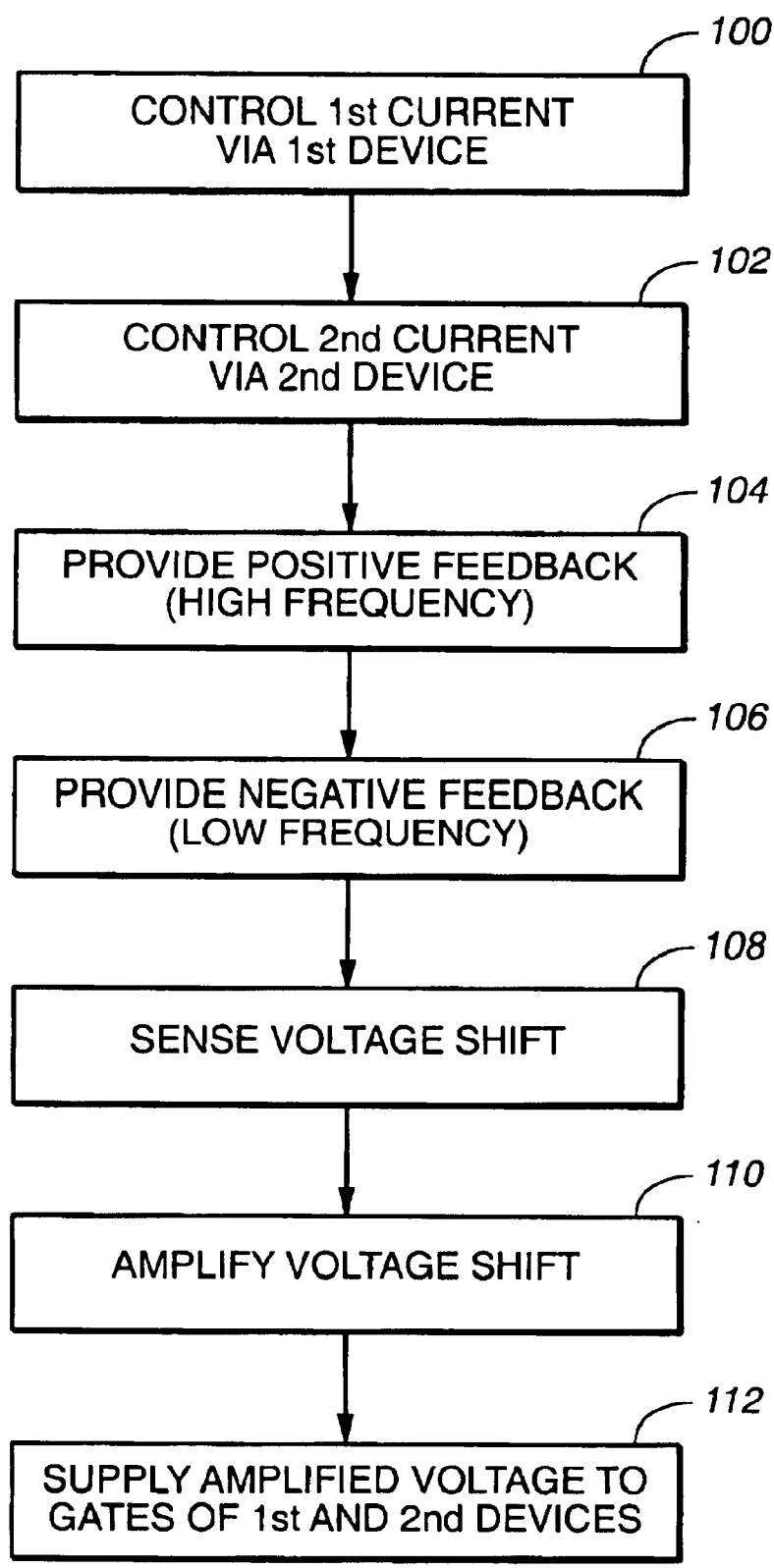
FIG._6

US 6,750,726 B1

OSCILLATOR CIRCUIT WITH FLICKER NOISE SUPPRESSION AND METHOD FOR OPERATING THE SAME

FIELD OF THE INVENTION

The present invention relates to an integrated circuit design. More particularly, the present invention relates to an oscillator circuit and a method for operating the same.

BACKGROUND OF THE INVENTION

Frequency synthesizers are commonly used in modern integrated circuits (ICs) to generate high frequency outputs that are used to frequency-modulate a desired signal. A frequency synthesizer typically includes a reference clock, a phase detector, a loop filter, a frequency divider, and a voltage-controlled oscillator (VCO). Among them, the VCO tends to dominate the critical performance metric of phase noise.

FIG. 1 schematically illustrates a conventional "cross-coupled" VCO 10. The operation of this type of cross-coupled oscillator depends on the regeneration loops (positive feedback loops) formed with active devices M0 and M1. This type of VCO is easy to implement, and oscillation is guaranteed so long as the loop gain is greater than one. In addition, the VCO 10 generates differential outputs that are insensitive to common mode noise, and a range of oscillation frequencies can be tuned by simply changing the common node voltage (A) of the varactors of the L-C tank. Therefore, cross-coupled oscillators are widely implemented in radio-frequency integrated circuits (RFIC).

The performance of an oscillator is quantified largely by its phase noise. The major sources contributing to phase noise include both the thermal noise from the L-C tank and the noise from the active devices M0 and M1. Unlike the L-C tank, the noise from the active devices includes not only the thermal noise, but also flicker noise which presents the greatest impact on phase noise. If only thermal noise were present from both the active devices and the L-C tank, the phase noise is shaped by the second-order response of the L-C tank, resulting in a −20 dB/decade slope in phase noise away from the carrier frequency, as shown in FIG. 2. However, flicker noise, which increases roughly on the order of 1/f above the thermal noise floor, contributes noise over a wide range of frequencies ranging from zero to hundreds of KHz in every metal oxide semiconductor (MOS) device. Although the flicker noise itself has a low frequency, it is the fundamental fact that the low-frequency noise components are upconverted around the center frequency ($f_0$) of the oscillator. Therefore, combining both thermal and flicker noises, a strong −30 dB/decade phase noise curve appears near the carrier frequency ($f_0$), and the noise curve eventually falls back to the 20 dB/decade slope due to the disappearance of flicker noise at frequencies far away from the oscillation frequency.

The breakpoint from −20 dB/decade rolloff and −30 dB/decade rolloff varies depending on the semiconductor process of the active devices. Furthermore, even for a given process technology such as 0.18 $\mu$m at a same fab, the device 1/f parameters change across several manufacturing lots and/or runs, which in turns leads to change in thermal and flicker noise breakpoint. In summary, the flicker noise of the active devices in the oscillator causes higher close-in phase noise that varies dramatically over different processes.

One possible solution to the flicker noise problem is to make the frequency synthesis loop wideband, since a wider loop filter bandwidth in the phase-locked loop may be able to reduce close-in phase noise at output. However, it would be extremely difficult to arbitrarily widen the loop bandwidth due to limitations in loop stability, loop accuracy, acquisition time, parasitic spur suppression, and the like. Therefore, there are some approaches provide low close-in phase noise by reducing the up-converted flicker noise from the active regeneration devices.

One conventional approach is to modify the VCO circuit by adding a pair of PMOS load and reducing the up-converted flicker noise from both NMOS and PMOS pairs. It has been shown that, assuming the rise-fall times in the loop are balanced, 1/f noise upconversion can be suppressed. Balancing the rise-fall times is tantamount to matching the drive strengths of the NMOS and PMOS devices.

However, balancing the rise-fall times over process and temperature has major disadvantage to this topology. Across process, it is highly unlikely to achieve perfectly balanced switching waveforms. Furthermore, any residual imbalance will result in some upconversion of 1/f noise—the fact that this solution also introduces another pair of PMOS devices makes its intrinsic 1/f noise substantially greater, and hence exacerbates the rise-fall balance requirements.

Therefore, it would be desirable to provide a VCO having intrinsically low close-in phase noise.

BRIEF DESCRIPTION OF THE INVENTION

An oscillator circuit includes an electrical load, a first metal oxide semiconductor (MOS) device, a second MOS device, and a negative feedback circuit. The electrical load is coupled between a first node and a second node. The first node outputs a first oscillating voltage having a first peak voltage, and the second node outputs a second oscillating voltage having a second peak voltage. The first MOS device is coupled between the first node and a third node, and controls a first current flowing from the first node to the third node. The second MOS device is coupled between the second node and a fourth node, and controls a second current flowing from the second node to the fourth node. A positive feedback circuit is formed with the first and second MOS devices. The positive feedback circuit has inputs from the first and second nodes and outputs to the first and second MOS devices. The negative feedback circuit has inputs from the third and fourth nodes and outputs to the first and second MOS devices.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1 is an electrical diagram schematically illustrating a conventional "cross-coupled" voltage controlled oscillator.

FIG. 2 is a diagram schematically illustrating phase noise of an oscillator.

FIG. 3 is an electrical diagram schematically illustrating an oscillator circuit in accordance with one embodiment of the present invention.

FIG. 4 is an electrical diagram schematically illustrating an oscillator circuit employing a PMOS topology in accordance with one embodiment of the present invention.

FIG. 5 is an electrical diagram schematically illustrating an oscillator circuit in accordance with one embodiment of the present invention.

FIG. 6 is a process flow diagram schematically illustrating a method for operating an oscillator circuit in accordance with one embodiment of the present invention.

DETAILED DESCRIPTION

Embodiments of the present invention are described herein in the context of an oscillator circuit with flicker noise suppression and a method for operating the same. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 3 schematically illustrates an oscillator circuit 20 in accordance with one embodiment of the present invention. The oscillator circuit 20 includes an electrical load 22, a first metal oxide semiconductor (MOS) device (M0) 24, a second MOS device (M1) 26, a positive feedback circuit 28, and a negative feedback circuit 30. Typically, the first and second devices 24 and 26 are NMOS devices, as shown in FIG. 3. The electrical load 22 is coupled between a first node 32 and a second node 34. The electrical load 22 is typically an L-C tank, but other type of electrical load may be used. A first oscillating voltage having a first peak voltage is output from the first node 32, and a second oscillating voltage having a second peak voltage is output from the second node 34. The oscillator circuit 20 may be used for a RFIC.

As shown in FIG. 3, the first MOS device 24 is coupled between the first node 32 and a third node 36. The first MOS device 24 controls a first current ($I_1$) flowing from the first node 32 to the third node 36. The second MOS device 26 is coupled between the second node 34 and a fourth node 38. The second MOS device 26 controls a second current ($I_2$) flowing from the second node 34 to the fourth node 38. The positive feedback circuit 28 is formed with the first and second MOS devices 24 and 26. The positive feedback circuit 28 has inputs from the first and second nodes 32 and 34 and outputs to the first and second MOS devices 24 and 26. The first MOS device 24 receives a positive feedback with respect to the first current $I_1$ through a first feedback path from the first node 32 to the second MOS device 26 to the second node 34 and to the gate of the first MOS device 24. Similarly, the second MOS device 26 receives a positive feedback with respect to the second current $I_2$ through a second feedback path from the second node 34 to the first MOS device 24 to the first node 32 and to the gate of the second MOS device 24.

As shown in FIG. 3, the negative feedback circuit 30 has inputs from the third and fourth nodes 36 and 38 and outputs to the first and second MOS devices 24 and 26. The negative feedback circuit 30 includes an amplifier circuit 40, a first resistance (resistor R0) 42, and a second resistance (resistor R1) 44. The first resistance 42 is coupled between the third node 36 and a current source node 50, and senses a first voltage ($V_1$) between the third node 36 and the current source node 50 to which a current source 52 is coupled. The second resistance 44 is coupled between the current source node 50 and the fourth node 38, and senses a second voltage ($V_2$) between the current source node 50 and the fourth node 38. The amplifier circuit 40 is coupled to the third and fourth nodes 36 and 38, and provides an amplified voltage ($\alpha\Delta V$) between the gate of the first MOS device 24 and the gate of the second MOS device 26 in accordance with the first and second voltages $V_1$ and $V_2$. The negative feedback circuit 30 may further include a third resistance (resistor R2) and a fourth resistance (resistor R3) 48. The third resistance 46 is coupled between a first output of the amplifier circuit 40 and the gate of the second MOS device 26, and the fourth resistance 48 is coupled between a second output of the amplifier circuit 40 and the gate of the first MOS device 24.

As shown in FIG. 3, the two current-sensing resistors (R0 and R1) are placed on the source side of the first and second MOS devices 24 and 26, respectively, and connected to the inputs of the amplifier circuit 40. The amplifier 40 receives at its two inputs a voltage difference ($\Delta V$) between the third and fourth nodes 36 and 38, which is given as $\Delta V = V_1 + V_2$. The amplifier 40 has a wide bandwidth and sufficient voltage gain ($\alpha$) so as to achieve flicker noise suppression. The differential outputs ($\alpha\Delta V$) of the amplifier circuit 40 are fed back to the gates of the first and second MOS devices 24 and 26 via two high-impedance resistors (R2 and R3). This combination of the first and second resistances 24 and 26, the amplifier circuit 40, and the third and fourth resistances 46 and 48 forms a negative feedback loop, i.e., the negative feedback circuit 30.

The negative feedback circuit 30 senses any shift in the oscillation waveform due to the 1/f noise and attempts to cancel it. Whenever the flicker noise causes a perturbation in the switching frequency of the oscillator, the respective amount of the DC currents ($I_1$ and $I_2$) passing through the differential pair (the first and second MOS devices 24 and 26) will be different. The shifts in the DC currents $I_1$ and $I_2$ are sensed by the two resistors R0 and R1, respectively, and a non-zero voltage ($\Delta V$) is generated between the third and fourth nodes 36 and 38, i.e., at the inputs of the amplifier 40. As long as the amplifier 40 has sufficient gain $\alpha$, it generates moderate differential output voltages between the gate of the first and second MOS devices 24 and 26, driving the both devices 24 and 26 such that the voltage shift $\Delta V$ becomes zero, i.e., driving the first and second MOS devices 24 and 26 into a balanced state.

In accordance with one embodiment of the present invention, the positive feedback circuit 28 further includes a first AC coupling (capacitor C0) 54 from the first node 32 to the gate of the second MOS device 26, and a second AC coupling (capacitor C1) 56 from the second node 34 to the gate of the first MOS device 24. It should be noted that the positive feedback circuit 28 provides a high frequency feedback loop for the oscillation, and the negative feedback circuit 30 provides a low frequency feedback path for canceling the flicker noise. These AC-coupling capacitors C0 and C1 are used to separate the high frequency positive feedback loop of the oscillator itself from the low frequency negative feedback loop, so that the noise suppression feedback does not affect the oscillation itself.

The input signals of the amplifier 40 reflect the low frequency voltage shifts ($\Delta V$) generated by the flicker noise, and the actual oscillator signal typically have much higher frequencies, for example, at around GHz frequencies. Since the amplifier 40 does not (by design) have a GHz-response bandwidth, it ignores the oscillator signal and senses only the low-frequency DC shifts. In addition, the high frequency oscillation signals cannot appear at the outputs of the amplifier 40 because of relatively large resistances 46 and 48 compared to the output impedance of the amplifier 40. Through this arrangement, neither the critical oscillation loop nor the quality factor (Q) of L-C tank 22 is disturbed by the noise- suppression loop of the negative feedback circuit 30. The amplifier 40 can suppress the flicker noise up to the limit of the loop bandwidth of the negative feedback loop. Thus, the gain-bandwidth of the negative feedback circuit 30 is maximized in order to achieve effective and/or desired noise suppression.

While a pair of NMOS devices are used in the oscillator circuit 20, a pair of PMOS devices can be used instead as the regeneration devices (M0 and M1) in the positive feedback circuit. FIG. 4 schematically illustrates an oscillator circuit 60 employing the PMOS topology. The operation of the oscillator circuit 60 will be well understood by those of ordinary skill in the art from the description of the oscillator circuit 20 in the previous embodiment without further explanation.

In some cases, providing a pair of NMOS drivers (as active devices in a positive feedback circuit) with a pair of PMOS load is still preferred, although this might introduce additional 1/f noise if they were used in a conventional oscillator configuration described above. For example, such a topology may have advantages of power supply noise rejection and/or output swing considerations. In accordance with one embodiment of the present invention, such an NMOS driver-PMOS load topology can be implemented on an oscillator circuit without any penalty. FIG. 5 schematically illustrates such an oscillator circuit 70 in accordance with one embodiment of the present invention.

As shown in FIG. 5, the oscillator circuit 70 includes the same structure as the oscillator circuit 20. The like components are denoted by the like numerals as the oscillator circuit 20. The oscillator circuit 70 includes, in addition to the structure the same as that of the oscillator circuit 20, a third MOS device 72, a fourth MOS device 74, a second positive feedback circuit 76, and a second negative feedback circuit 78. Since the first and second MOS devices 24 and 26 are NMOS devices, the third and fourth MOS devices are PMOS devices.

The third MOS device 72 is coupled between the first node 32 and a fifth node 80, and controls a third current ($I_3$) flowing from the first node 32 to the fifth node 80. The fourth MOS device 74 is coupled between the second node 34 and a sixth node 82, and controls a fourth current ($I_4$) flowing from the second node 34 to the sixth node 82. The second positive feedback circuit 75 is formed with the third and fourth MOS devices 72 and 74. The second positive feedback circuit 76 has inputs from the first and second nodes 32 and 34 and outputs to the third and fourth MOS devices 72 and 74. The second negative feedback circuit 78 is coupled from the fifth and sixth nodes 80 and 82 to the third and fourth MOS devices 72 and 74.

As shown in FIG. 5, the second negative feedback circuit 78 includes a second amplifier circuit 84, a fifth resistance 86, and a sixth resistance 88. The fifth resistance 86 is coupled between the fifth node 80 and a second current source node 90, and senses a third voltage ($V_3$) between the fifth node 80 and the second current source node 90. The sixth resistance 88 is coupled between the second current source node 90 and the sixth node 82, and senses a fourth voltage ($V_4$) between the second current source node 90 and the sixth node 82. The second amplifier circuit 84 is coupled to the fifth and sixth nodes 80 and 82, and provides a second amplified voltage between the gate of the third MOS device 72 and the gate of the fourth MOS device 74 in accordance with the third and fourth voltages. The second negative feedback circuit 78 further includes a seventh resistance 92 and a eighth resistance 94. The seventh resistance 92 is coupled between a first output of the second amplifier circuit 84 and the gate of the fourth MOS device 74, and the eighth resistance 94 is coupled between a second output of the second amplifier circuit 84 and the gate of the third MOS device 72.

Similar to the previous embodiment, the second positive feedback circuit 76 includes a high frequency feedback path, and the second negative feedback circuit 78 includes a low frequency feedback path. Thus, in accordance with one embodiment of the present invention, the second positive feedback circuit 76 includes a third AC coupling (AC-coupling capacitor) 96 from the first node 32 to a gate of the fourth MOS device 74, and a fourth AC coupling (AC-coupling capacitor) 98 from the second node 34 to a gate of the third MOS device 72.

The operation of the oscillator circuit 70 is well understood by those of ordinary skill in the art from the operation of the oscillator circuit 20, as described above, without further explanation. In accordance with this embodiment, the negative feedback circuits 30 and 78 cancel the I/f noise of both the PMOS devices and NMOS devices.

FIG. 6 schematically illustrates a method for operating an oscillator circuit in accordance with one embodiment of the present invention. The oscillator circuit includes an electrical load coupled between a first node and a second node, a first device coupled between the first node and a third node, and a second device coupled between the second node and a fourth node. The oscillator circuit may be the oscillator circuit 20 or the oscillator circuit 60 described above.

The method includes controlling, via the first device, a first current flowing from the first node to the third node (100), and controlling, via the second device, a second current flowing from the second node to the fourth node (102). A positive feedback is provided from the first and second nodes to the first and second devices (104), and a negative feedback is provided to the first and second devices in accordance with a differential voltage between the third node and the fourth node (106).

In accordance with one embodiment of the present invention, the positive feedback is provided through a capacitive coupling between the first node and the gate of the second device, and through a capacitive coupling between the second node and the gate of the first device.

In accordance with one embodiment of the present invention, providing the negative feedback (106) includes sensing the differential voltage (voltage shift) between the third node and the fourth node (108), amplifying the differential voltage (110), and providing an amplified differential voltage between the gate of the first device and the gate of the second device via a resistive coupling (112).

As described above, the flicker noise of active devices (MOSFETs) is actively suppressed using an additional amplifier with two current-sensing resistors. The negative-feedback noise-suppression circuit can efficiently remove flicker noise caused by the active MOS with relatively minor increase on power and area It requires no changes in the high-frequency positive-feedback loop, and neither adds parasitics in the L-C tank nor degrades the quality factor (Q) of the L-C tank. In addition, the oscillator circuit in accordance with the embodiments of the present invention automatically corrects any static mismatch between the oscillator's critical MOS devices (M0 and M1). The oscillator performance is not sensitive to process corners so long as the amplifier has sufficient gain-bandwidth to suppress the low frequency noise.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An oscillator circuit comprising:
   an electrical load coupled between a first node and a second node, the first node outputting a first oscillating voltage having a first peak voltage, and the second node outputting a second oscillating voltage having a second peak voltage;
   a first metal oxide semiconductor (MOS) device coupled between the first node and a third node, said first MOS device controlling a first current flowing from the first node to the third node;
   a second MOS device coupled between the second node and a fourth node, said second MOS device controlling a second current flowing from the second node to the fourth node, a positive feedback circuit being formed with said first and second MOS devices, the positive feedback circuit having inputs from the first and second nodes and outputs to said first and second MOS devices; and
   a negative feedback circuit having inputs from the third and fourth nodes and outputs to said first and second MOS devices.

2. An oscillator circuit in accordance with claim 1 wherein said positive feedback circuit includes a high frequency feedback path, and said negative feedback circuit includes a low frequency feedback path.

3. An oscillator circuit in accordance with claim 1 wherein said positive feedback circuit includes:
   a first AC coupling from said first node to a gate of said second MOS device; and
   a second AC coupling from said second node to a gate of said first MOS device.

4. An oscillator circuit in accordance with claim 1 wherein said negative feedback circuit includes:
   a first resistance coupled between the third node and a current source node, said first resistance sensing a first voltage between the third node and the current source node;
   a second resistance coupled between the current source node and the fourth node, said second resistance sensing a second voltage between the current source node and the fourth node; and
   an amplifier circuit coupled to said third and fourth nodes, said amplifier circuit providing an amplified voltage between the gate of said first MOS device and the gate of said second MOS device in accordance with the first and second voltages.

5. An oscillator circuit in accordance with claim 4 wherein said negative feedback circuit further includes:

a third resistance coupled between a first output of said amplifier circuit and the gate of said second MOS device; and
a fourth resistance coupled between a second output of said amplifier circuit and the gate of said first MOS device.

6. An oscillator circuit in accordance with claim 1 wherein said first and second devices are NMOS devices.

7. An oscillator circuit in accordance with claim 1 wherein said first and second devices are PMOS devices.

8. An oscillator circuit in accordance with claim 1, further comprising:
   a third MOS device coupled between the first node and a fifth node, said third MOS device controlling a third current flowing from the first node to the fifth node;
   a fourth MOS device coupled between the second node and a sixth node, said fourth MOS device controlling a fourth current flowing from the second node to the sixth node, a second positive feedback circuit being formed with said third and fourth MOS devices, the second positive feedback circuit having inputs from the first and second nodes and outputs to said third and fourth MOS devices; and
   a second negative feedback circuit coupled from the fifth and sixth nodes to said third and fourth MOS devices.

9. An oscillator circuit in accordance with claim 8 wherein said second positive feedback circuit includes a high frequency feedback path, and said second negative feedback circuit includes a low frequency feedback path.

10. An oscillator circuit in accordance with claim 8 wherein said second positive feedback circuit includes:
    a third AC coupling from said first node to a gate of said fourth MOS device; and
    a fourth AC coupling from said second node to a gate of said third MOS device.

11. An oscillator circuit in accordance with claim 8 wherein said second negative feedback circuit includes:
    a fifth resistance coupled between the fifth node and a second current source node, said fifth resistance sensing a third voltage between the fifth node and the second current source node;
    a sixth resistance coupled between the second current source node and the sixth node, said sixth resistance sensing a fourth voltage between the second current source node and the sixth node; and
    a second amplifier circuit coupled to said fifth and sixth nodes, said second amplifier circuit providing a second amplified voltage between the gate of said third MOS device and the gate of said fourth MOS device in accordance with the third and fourth voltages.

12. An oscillator circuit in accordance with claim 11 wherein said second negative feedback circuit further includes:
    a seventh resistance coupled between a first output of said second amplifier circuit and the gate of said fourth MOS device; and
    an eighth resistance coupled between a second output of said second amplifier circuit and the gate of said third MOS device.

13. An oscillator circuit in accordance with claim 8 wherein said first and second MOS devices are NMOS devices, and said third and fourth MOS devices are PMOS devices.

14. An oscillator circuit in accordance with claim 1 wherein said electrical load is an L-C tank.

15. An oscillator circuit comprising:
   an electrical load coupled between a first node and a second node;
   a first MOS device, a drain of said first MOS device being coupled to the first node, a source of said first MOS device being couple to a third node, and a gate of said first MOS device being coupled with the second node;
   a second MOS device, a drain of said second MOS device being couple to the second node, a source of said second MOS device being coupled to a fourth node, and a gate of said second MOS device being coupled with the first node;
   a first resistance coupled between the third node and a current source node;
   a second resistance coupled between the fourth node and the current source node;
   an amplifier having a first input, a second input, a first output, and a second output, the first input being coupled to the third node, the second input being coupled to the fourth node;
   a third resistance coupled between the first output and the gate of said second MOS device; and
   a fourth resistance coupled between the second output and the gate of said first MOS device.

16. An oscillator circuit in accordance with claim 15, further comprising:
   a first capacitance provided between the first node and the gate of said second MOS device; and
   a second capacitance provided between the second node and the gate of said first MOS device.

17. An oscillator circuit in accordance with claim 15 wherein said first and second MOS devices are NMOS devices.

18. An oscillator circuit in accordance with claim 15 wherein said first and second MOS devices are PMOS devices.

19. An oscillator circuit in accordance with 15, further comprising:
   a third MOS device, a drain of said third MOS device being coupled to the first node, a source of said third MOS device being couple to a fifth node, and a gate of said third MOS device being coupled with the second node;
   a fourth MOS device, a drain of said fourth MOS device being couple to the second node, a source of said fourth MOS device being coupled to a sixth node, and a gate of said fourth MOS device being coupled with the first node;
   a fifth resistance coupled between the fifth node and a second current source node;
   a sixth resistance coupled between the sixth node and the second current source node;
   a second amplifier having a first input, a second input, a first output, and a second output, the first input being coupled to the fifth node, the second input being coupled to the sixth node;
   a seventh resistance coupled between the first output of the second amplifier and the gate of said fourth MOS device; and
   a eighth resistance coupled between the second output of the second amplifier and the gate of said third MOS device.

20. An oscillator circuit in accordance with claim 19, further comprising:
   a third capacitance provided between the first node and the gate of said fourth MOS device; and
   a fourth capacitance provided between the second node and the gate of said third MOS device.

21. An oscillator circuit in accordance with claim 19 wherein said first and second MOS devices are NMOS devices, and said third and fourth MOS devices are PMOS devices.

22. An oscillator circuit in accordance with claim 15 wherein said electrical load is an L-C tank.

23. A method for operating an oscillator circuit, the oscillator circuit including an electrical load coupled between a first node and a second node, a first device coupled between the first node and a third node, and a second device coupled between the second node and a fourth node, said method comprising;
   controlling, via the first device, a first current flowing from the first node to the third node;
   controlling, via the second device, a second current flowing from the second node to the fourth node;
   providing a positive feedback from the first and second nodes to the first and second devices; and
   providing a negative feedback to said first and second devices in accordance with a differential voltage between the third node and the fourth node.

24. A method in accordance with claim 23 wherein said providing the positive feedback includes:
   providing a capacitive coupling between the first node and the gate of the second device; and
   providing a capacitive coupling between the second node and the gate of the first device.

25. A method in accordance with claim 23 wherein said providing the negative feedback includes:
   sensing the differential voltage between the third node and the fourth node;
   amplifying the differential voltage; and
   providing an amplified differential voltage between the gate of the first device and the gate of the second device.

26. A method in accordance with claim 23 wherein said providing the amplified voltage is via a resistive coupling.

* * * * *